United States Patent [19]

Seabaugh et al.

[11] Patent Number: 5,422,305
[45] Date of Patent: Jun. 6, 1995

[54] METHOD OF FORMING IMPLANTED SILICON RESONANT TUNNELING BARRIERS

[75] Inventors: Alan C. Seabaugh, Richardson; Harold H. Hosack, Dallas, both of Tex.

[73] Assignee: Texas Instruments Incorporated, Dallas, Tex.

[21] Appl. No.: 250,976

[22] Filed: May 31, 1994

Related U.S. Application Data

[63] Continuation-in-part of Ser. No. 145,267, Oct. 29, 1993.
[51] Int. Cl.[6] .............................................. H01L 21/20
[52] U.S. Cl. .................................... 437/126; 437/89; 437/110
[58] Field of Search ................ 437/89, 110, 126, 904, 437/969; 148/DIG. 67, DIG. 72

[56] References Cited

U.S. PATENT DOCUMENTS

| | | | |
|---|---|---|---|
| 5,013,685 | 5/1991 | Chiu et al. | 437/126 |
| 5,192,709 | 3/1993 | Petroff | 437/110 |
| 5,216,262 | 6/1993 | Tsu | 257/25 |
| 5,234,848 | 8/1993 | Seabaugh | 437/126 |
| 5,342,804 | 8/1994 | Beam, III | 437/89 |

*Primary Examiner*—Brian E. Hearn
*Assistant Examiner*—Chandra Chaudhari
*Attorney, Agent, or Firm*—Carlton H. Hoel; Richard A. Stoltz; Richard L. Donaldson

[57] ABSTRACT

A resonant tunneling diode (400) made of a silicon quantum well (406) with silicon oxide tunneling barriers (404, 408). The tunneling barriers have characteristics of implanted oxygen segregated into oxide layers.

9 Claims, 8 Drawing Sheets

METHOD OF FORMING IMPLANTED SILICON RESONANT TUNNELING BARRIERS

CROSS-REFERENCE TO RELATED APPLICATIONS

This patent application is a continuation-in-part of the following U.S. patent application which has a common assignee: Ser. No. 08/145,267, filed Oct. 29, 1993.

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1. which illustrates a AlGaAs/GaAs quantum well. Further, Mars et al., Reproducible Growth and Application of AlAs/GaAs Double Barrier Resonant Tunneling Diodes, 11 J.Vac. Sci. Tech. B 965 (1993), and Özbay et al, 110-GHz Monolithic Resonant-Tunneling-Diode Trigger Circuit, 12 IEEE Elec. Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III-V semiconductors such as AlGaAs and GaAs, have focussed primarily on silicon-germanium alloys. For example, the Topical Conference on Silicon-Based Heterostructures II (Chicago 1992) included papers such as Griitzmacher et al., Very Narrow SiGe/Si Quantum Wells Deposited by Low-Temperature Atmospheric Pressure Chemical Vapor Deposition, 11 J.Vac. Sci.Tech. B 1083 (1993)(1 nm wide wells of $Si_{0.75}Ge_{0.25}$ with 10 nm wide Si tunneling barriers) and Sedgwick et al., Selective SiGe and Heavily As Doped Si Deposited at flow Temperature by Atmospheric Pressure Chemical Vapor Deposition, 11 J.Vac. Sci.Tech. B 1124 (1993)(Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset at SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley curent differences (greater than approximately 5). Further, the addition of a strained heterojunction and new material, germanium, necessitates the undesirable development and implementation of new low temperature fabrication methods to allow production.

Tsu, U.S. Pat. No. 5,216,262, describes a silicon-based quantum well structure with tunneling barriers made of short period silicon/silicon dioxide super lattices of epitaxial silicon dioxide two monolayers thick.

Numerous investigators have studied the silicon/silicon oxide interface because it underlies performance of the currently prevalent CMOS transistor structure of silicon integrated circuits. The growth and analysis of single molecular layers of oxide have become commonplace. For example, Ohmi et al., Very Thin Oxide Film on a Silicon Surface by Ultraclean Oxidation, 60 Appl. Phys. Lett. 2126 (1992); Hattori, High Resolution X-ray Photoemission Spectroscopy Studies of Thin $SiO_2$ and $Si/SiO_2$ Interfaces, 11 J.Vac. Sci.Tech. B 1528 (1993); and Seiple et al., Elevated Temperature Oxidation and Etching of the Si(111) 7×7 Surface Observed with Scanning Tunneling Microscopy, 11 J.Vac. Sci. Tech. A 1649 (1993). The Ohmi et al. article observes that an oxide monolayer formed on a silicon wafer at 300° C. provides the foundation for oxide films superior to standard thermal oxide with respect to Frenkel-Poole emission for thin oxide films.

SUMMARY OF THE INVENTION

The present invention provides silicon-based resonant tunneling diodes and transistors by use of at least one implanted dielectric tunneling barrier.

This has technical advantages including fabrication of resonant tunneling devices with standard silicon processes.

BRIEF DESCRIPTION OF THE DRAWINGS

The drawings are schematic for clarity.

DESCRIPTION OF THE PREFERRED EMBODIMENTS

Overview of Implanted Tunneling Barrier

Figure 4A:
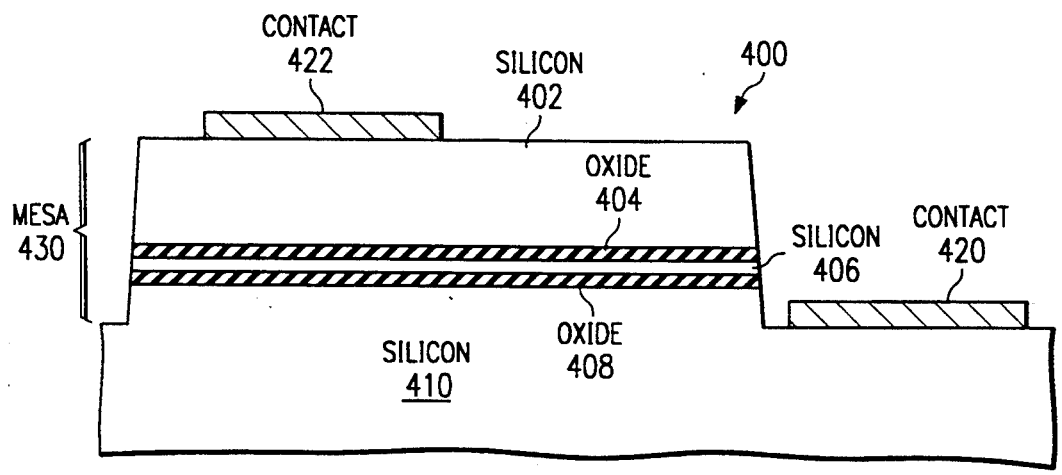
FIGS. 4a–b illustrate a first preferred embodiment resonant tunneling diode in cross sectional elevation and plan views.
Figure 4B:
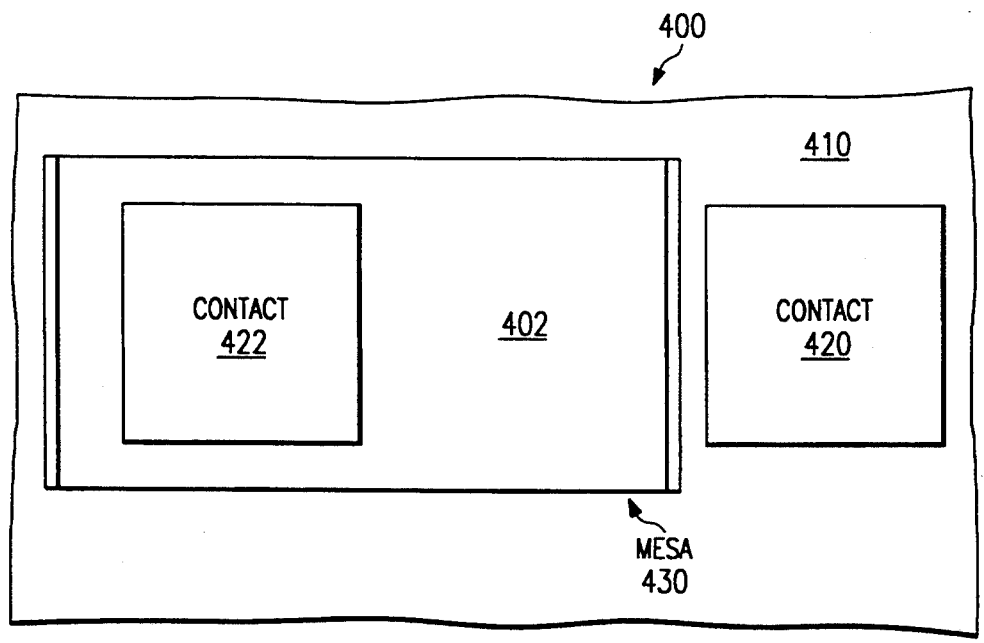

FIGS. 4a–b heuristically show first preferred embodiment resonant tunneling diode, generally denoted by reference numeral 400, in cross sectional elevation and plan views as including silicon anode 402, silicon dioxide ("oxide") tunneling barrier 404, silicon quantum well 406, oxide tunneling barrier 408, silicon cathode 410, anode metal contact 422, and cathode metal contact 420. The plan view in FIG. 4b illustrates the mesa 430 structure of the stack of tunneling barriers 404/408 and quantum well 406. Tunneling barriers 404/408 are each about 2 nm thick (roughly 8 molecular layers and amorphous) with transition layers and about 10 μm by 20 μm (thus FIGS. 4a–b are not to scale). Quantum well 406 is about 4 nm thick. Note that the thickness of barriers 404/408 primarily impacts the tunneling current magnitude and not the resonance levels which derives from the quantum well width and the barrier heights. Also, the exact electronic and chemical nature of the tunneling barriers varies through the barrier.

The spread of a wave packet describing an electron in a periodic potential (i.e., an electron in the single crystal silicon of anode 402, quantum well 406, or cathode 410) is roughly the reciprocal of the spread of wave vectors making up the wave packet. Thus with a spread of wave vectors small compared to dimensions of the Brillouin zone (which would be required for any resonance with respect to wave vector), the wave packet spread is over many crystal primitive cells. The wave packet spread in silicon is at least roughly 4 nm or more than 7 primitive cells.

Figure 5A:
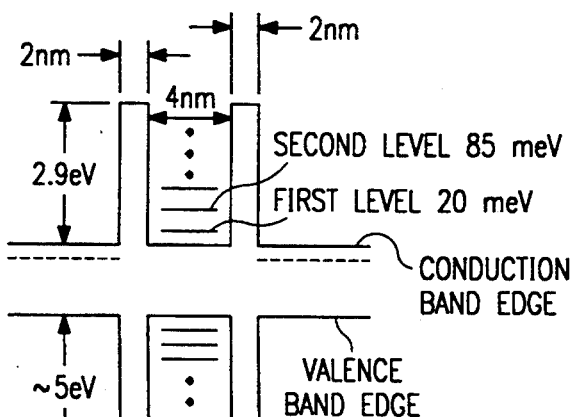
FIGS. 5a–c are band diagrams for the first preferred embodiment diode with various biases.
Figure 5B:
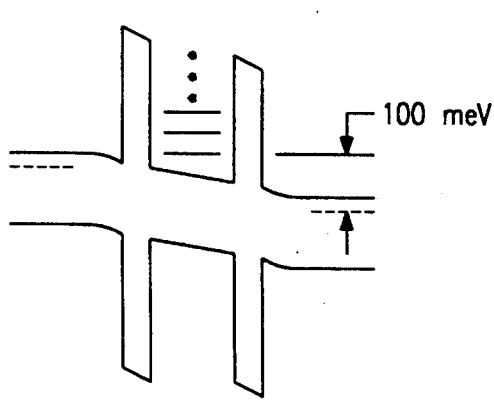
Figure 5C:
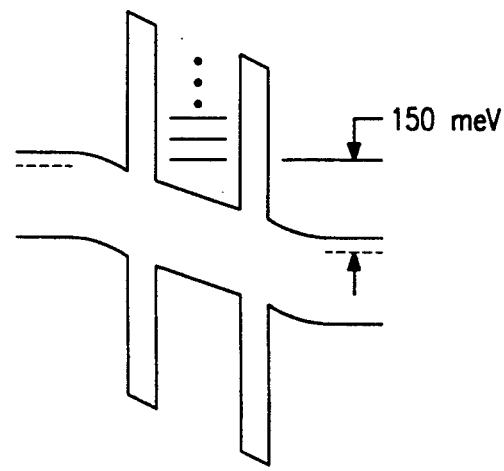

The width of quantum well 406 as 4 nm implies the edges of the lowest conduction subbands should lie at about 20 meV, 85 meV, 200 meV, and 350 meV above the conduction band edge due to the quantized component of crystal momentum in the quantum well. The conduction band offset at the silicon/oxide interface for very thin oxide is about 2.9 eV (compared with 3.2 eV for thick oxide), so FIG. 5a–c represents the band diagram for electron conduction through diode 400. In FIG. 5a a zero bias produces no current; in FIG. 5b a bias of approximately 100 mV across diode 400 yields the first resonant peak current; and in FIG. 5c a bias of approximately 150 mV across diode 400 leads to the first valley current. Note that anode 402 may be doped n+ except for a few nm abutting barrier 404, and cathode 410 may be also be doped n+ except for a few nm abutting barrier 408. Spacing the doping from the tunneling barriers avoids incorporating dopant atoms into the tunneling barrier and grid spacing regions where impurity-assisted tunneling can result. With a doped anode and cathode, the majority of the applied bias between anode and cathode appears across the barriers and quantum well. The dielectric constant of silicon is about three times that of oxide, so the applied voltage drop roughly splits into one third across the oxide barriers, one third across the quantum well, and one third across the undoped anode and cathode abutting the oxide barriers. The breakdown voltage for oxide is on the order of 10 MV/cm, so to avoid breakdown currents which may destroy the oxide barriers, voltage drops must be less than about 3 volts across the entire double barrier neglecting depletion on the cathode side of the tunneling barriers.

Tunneling barriers 404/408 are lubricated by ion implantation of oxygen which permits accurate control of the quantity of oxygen and hence the thickness of the barriers. The sharpness of the silicon-oxide interface depends upon the segregation of the oxygen into oxide as opposed to dispersion throughout the silicon.

Diode 400 thus provides resonant tunneling in a system using only standard integrated circuit materials: silicon and oxide; and may operate at room temperature.

Fabrication

FIGS. 6a–d illustrate in cross sectional elevation views a first preferred embodiment method of fabrication of diode 400 which includes the following steps:

(1) Begin with 25-mil thick, four-inch diameter, (100)-oriented silicon wafer 600. Epitaxially grow 1 μm thick n+ layer of silicon 602 on wafer 600 in an LPCVD reactor by decomposition of dichlorosilane with stibine ($SbH_3$) for in situ antimony doping. Note that the stibine flow could be turned off prior to the dichlororsilane to provide an upper portion (approximately 50–60 nm) of layer 602 with minimal doping. Next, thermally grow 100 nm thick layer of oxide 604 on layer 602; this consumes about 45 nm of layer 602 and leaves about 10 nm of minimally doped silicon abutting oxide 604. See FIG. 6a which indicates the minimally doped sublayer as 606. Note that oxide 604 will only act as an implant hard mask and could be replaced by any other convenient material such as silicon nitride or titanium-tungsten. Further, because diode 400 has a mesa structure, the hard mask is really only needed to protect other areas of the wafer during the diode fabrication.

(2) Spin on photoresist and pattern it to define an opening about 15 μm by 25 μm. Then use the patterned photoresist as an etch mask and etch exposed oxide 604 with an $HF/NH_4F$ solution. The $HF/NH_4F$ etch plus water rinse stabilizes the oxide-free silicon surface by forming a monohydride surface layer. The isotropy of the etch does not matter due to the noncritical dimensions of the opening. Next, strip the photoresist with acetone, and again rinse with $HF/NH_4F$ plus water to stabilize the silicon surface.

Figure 6A:
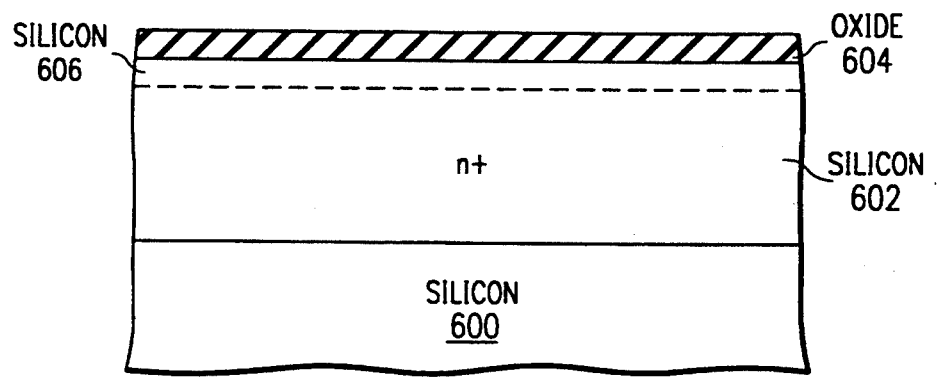
FIGS. 6a–d show fabrication steps of the first preferred embodiment method.
Figure 6B:
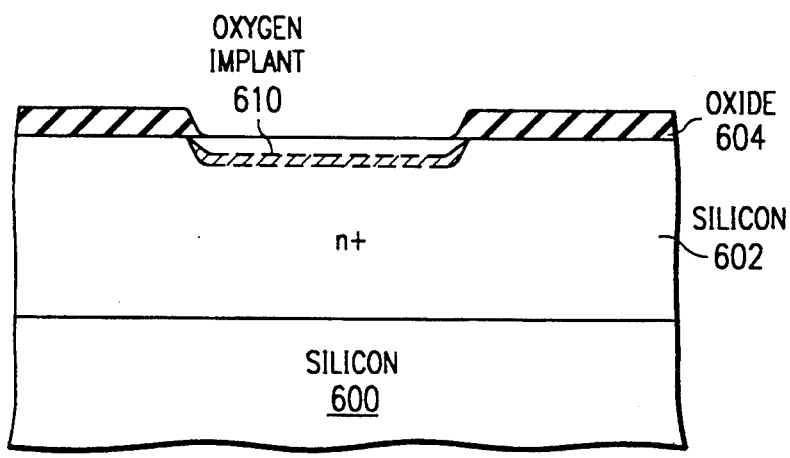

(3) Insert wafer 600 into an ion implanter (high vacuum) and implant oxygen at 1 KeV and a dose of about $1 \times 10^{16}$ atoms/cm$^2$ and with a wafer temperature of about 600° C. With wafer 600 tilted about 7 degrees to limit channeling, the projected range of the oxygen atoms is about 2.2 nm with a projected straggle of about 1.6 nm and a slightly larger transverse straggle of about 1.8 nm. The high wafer temperature insures continuous annealing during implantation, so the top silicon surface remains single crystal. See FIG. 6b illustrating the implanted oxygen as region 610. Implantation provides for control of the quantity of oxygen, and thus the eventual thickness of the tunneling barriers formed without the process control of the nonimplanted preferred embodiments.

(4) Anneal wafer 600 at 1200° C. in an inert atmosphere for 1 hour. During the anneal the implanted oxygen segregates into a buried oxide layer centered about the implanted oxygen peak concentration location 2.2 nm below the surface. If 90% of the oxygen segregates into this oxide layer, the oxide layer will be about 2 nm thick and will eventually form tunneling barrier 408 of diode 400. Note that some oxygen will be lost to evaporation from the surface, in forms such as SiO. The resulting annealed structure will have single crystal silicon about 1 nm thick on 2 nm thick oxide which is in turn on single crystal silicon. Alternatively, rapid (10 seconds) thermal annealing at upwards of 1400° C. can used to insure good oxygen segregation and high quality silicon-oxide interfaces. Also, the antimony dopant has low diffusivity, so the dopants can be kept spaced from the tunneling barrier. Note if the dopants penetrate the tunneling barriers, defect-assisted tunneling can occur which would disrupt the sharpness of the resonance of the resonant tunneling.

Figure 6C:
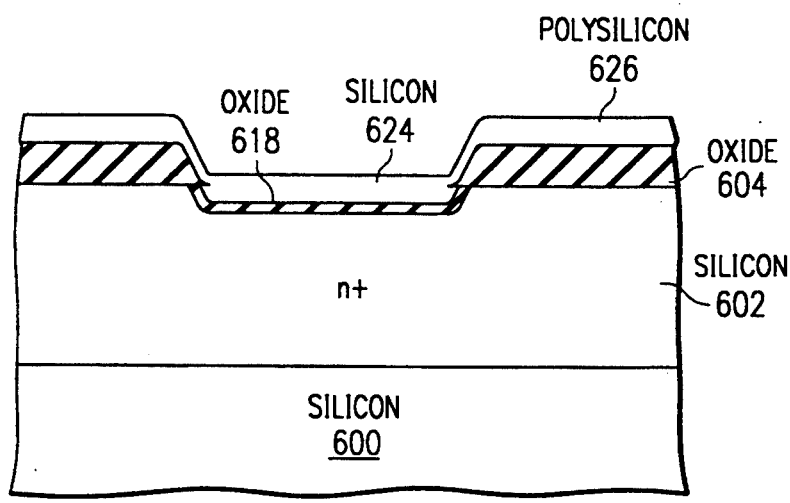
Figure 6D:
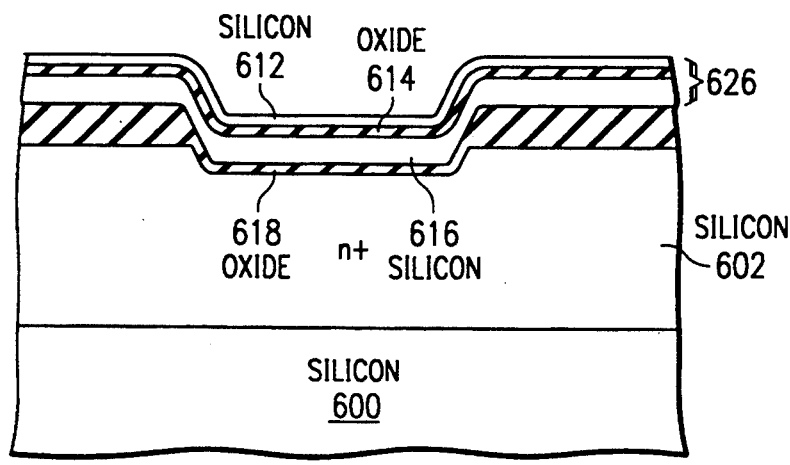

(5) This 1 nm thick silicon is too thin to support growth of a second oxide tunneling barrier, so insert wafer 600 into a CVD reactor and grow about 6 nm of epitaxial silicon from SiCl4 plus H2; this reaction at 900° C. only grows silicon at about 15 nm/min. Indeed, the anneal of step (3) could have been done in the CVD reactor prior to injecting the SiCl4 for epitaxial growth. The epitaxial growth will also deposit polysilicon on oxide 604; see FIG. 6c showing 2 nm thick buried oxide 618, 7 nm single crystal silicon 624, and polysilicon 626 on oxide 604. After the epitaxial growth, rinse water 600 with HF/NH4F plus water to stabilize the surface of silicon 624. Note that the rate of epitaxial growth can be controlled and the reaction even run in reverse to etch the silicon by control of the chlorine and hydrogen concentrations. Recall that the overall reaction is:

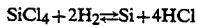

$$SiCl_4 + 2H_2 \rightleftharpoons Si + 4HCl$$

Control of the gasses permits driving the reaction in either direction.

(6) Repeat the implantation of oxygen at 1 KeV and a dose of $1 \times 10^{16}$ atoms/cm$^2$ as described in step (3) to form an oxygen rich region with peak oxygen concentration about 2.2 nm into silicon 624. Then repeat the anneal of step (4) to segregate the oxygen into oxide layer 614 which has a thickness of about 2 nm and is centered about 2.2 nm below the silicon surface. Oxide 614 thus splits silicon 624 into an approximately 1 nm thick silicon top layer 612 and an approximately 4 nm thick silicon layer 616 between the implanted oxide layers 614 and 616; see FIG. 6d which also shows the implanted oxide in polysilicon 626. Thus two oxide tunneling barriers, 614 and 616, have been formed with thickness controlled by oxygen implant dosage; and the silicon quantum well between the tunneling barriers has a thickness controlled by a slow epitaxial growth.

(7) Repeat the epitaxial silicon growth of step (5) but continue the growth and add in situ n-type dopant (antimony via stibine) until a 500 nm thick layer of silicon has grown on silicon 614. Next, spin on photoresist and pattern it to define the location for a 10μ by 20 μm mesa centered over the tunneling barriers 614–618 and quantum well 616. Then plasma etch with a fluorocarbon etchant to remove both oxide and polysilicon to form a mesa containing the tunneling barriers and quantum well as in FIGS. 4a–b. Note that a short thermal oxidation may be performed to passivate the mesa sidewalls.

Alternative Fabrication Methods of Implanted Embodiment

A second preferred embodiment method of fabrication for diode 400 begins with steps (1)–(3) of the first preferred embodiment method except the implant energy is about 3 KeV. This puts the peak concentration at about 6 nm below the surface and with a projected straggle of about 5 nm. Again, a high temperature anneal segregates the oxygen into an oxide layer of thickness about 2 nm centered about 6 nm below the surface. Because the straggle is much larger than with the first preferred embodiment, higher anneal temperatures and-/or longer anneal times will be required. The resulting silicon above the oxide layer is about 5 nm thick.

Next, grow a 2 nm thick oxide layer on the surface of the silicon as follows. First, clean wafer 600 by a rinse in an HF/NH4F solution to remove the roughly 1.4 nm of native oxide which grows when wafer 600 contacts air and then a rinse with deionized water. The HF/NH4F rinse stabilizes the oxide-free silicon surface by forming a monohydride surface layer. Next, insert wafer 600 into a furnace and heat it to 300° C. in an oxygen free argon atmosphere, and then oxidize wafer 600 at 300° C. in a moisture free oxygen atmosphere. This desorbs the hydrogen and grows a monolayer of oxide. Then after the oxide monolayer growth, heat the wafer to a growth temperature of 900° C. in oxygen free argon, and then inject sufficient oxygen to grow about 2 nm of oxide.

Figure 7:
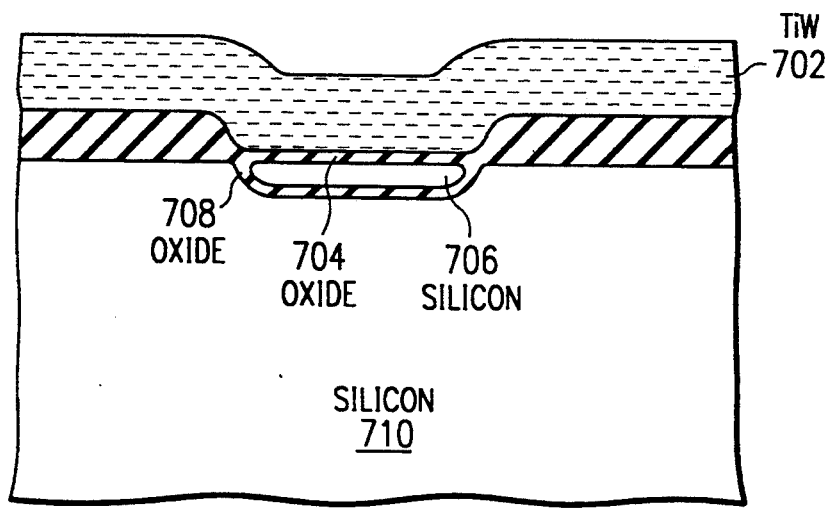
FIGS. 7–8 illustrate other preferred embodiment diodes.

Lastly, deposit a conductor (such as titanium-tungsten) on the top oxide to act as the anode; see FIG. 7 illustrating silicon wafer 710, 2 nm thick tunneling oxide 708, 4 nm thick silicon quantum well 706, 2 nm thick tunneling oxide 704, and silicon anode 702. Again, a photoresist masking plus etching and cathode contact yields the final mesa diode structure. The following embodiment shows how to put single crystal silicon on oxide 704 for the anode.

Grid Tunneling Oxide

Figure 8:
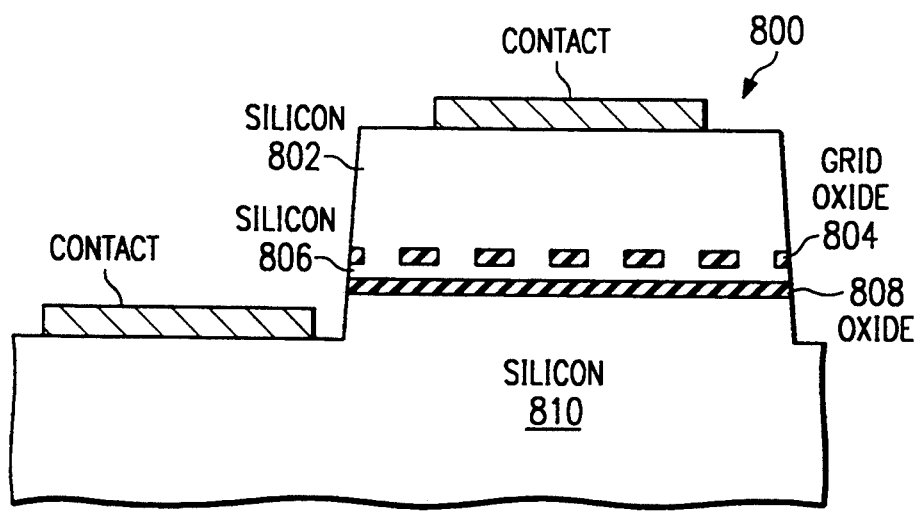
Figure 9A:
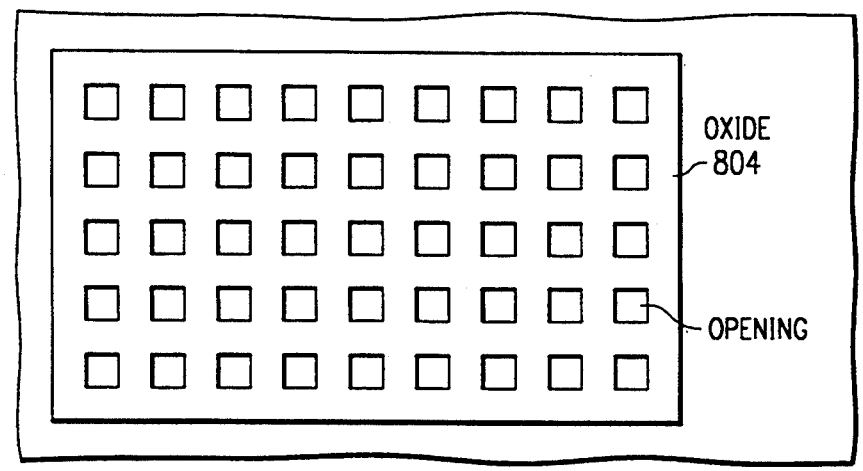
FIGS. 9a–c show grid tunneling oxide patterns.
Figure 9B:
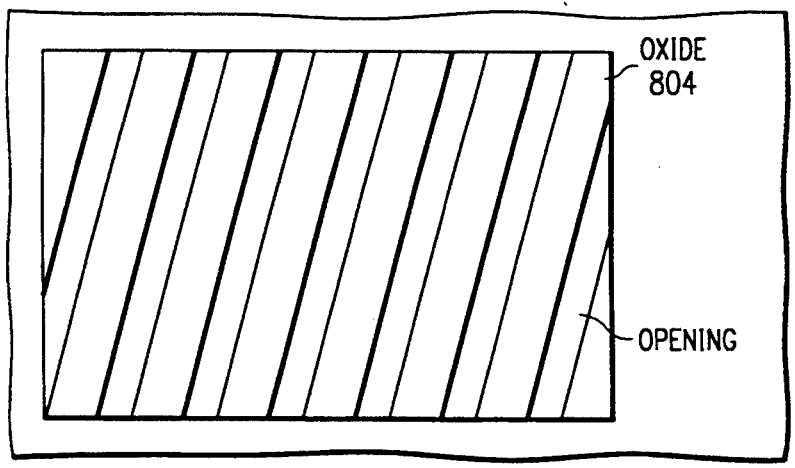
Figure 9C:
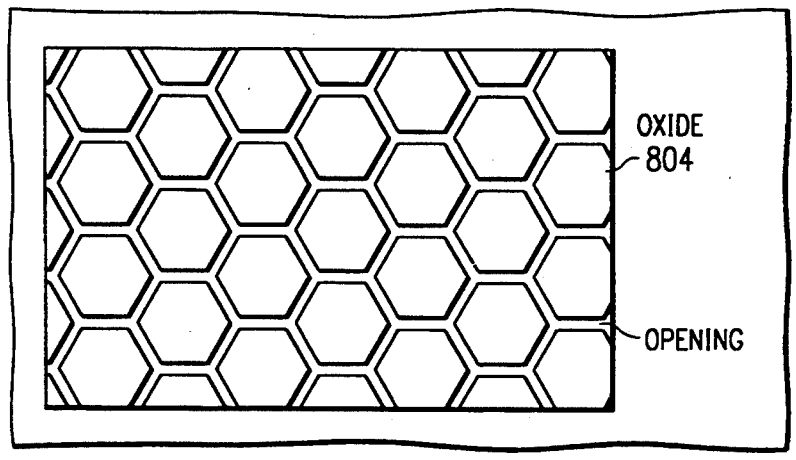

FIG. 8 illustrates preferred embodiment resonant tunneling diode 800 in cross sectional elevation view. Diode 800 is a modification of diode 400 to include upper oxide tunneling barrier 804 with a grid structure together with silicon anode 802, silicon quantum well 806, oxide tunneling barrier 808, silicon cathode 810, and anode plus cathode metal contacts. FIGS. 9a–c illustrate various possible grids for tunneling oxide 804 in plan view. The grid has a period of about 20 nm and a separation of less than approximately 4 nm in grid openings. The spread of a wave packet describing an electron in a periodic potential (i.e., an electron in the single crystal silicon of anode 802, quantum well 806, or cathode 810) is roughly the reciprocal of the spread of wave vectors making up the wave packet. Thus with a spread of wave vectors small compared to dimensions of the Brillouin zone (which would be required for any resonance with respect to wave vector), the wave packet spread is over many crystal primitive cells. The wave packet spread in silicon is at least roughly 4 nm or more than 7 primitive cells. Each of openings in the tunneling barrier oxide 804 grid has a diameter of at most 4 nm and may be smaller. Hence, tunneling barriers 804 will appear to electrons (wave packets) as continuous and without penetrable openings.

Figure 10:
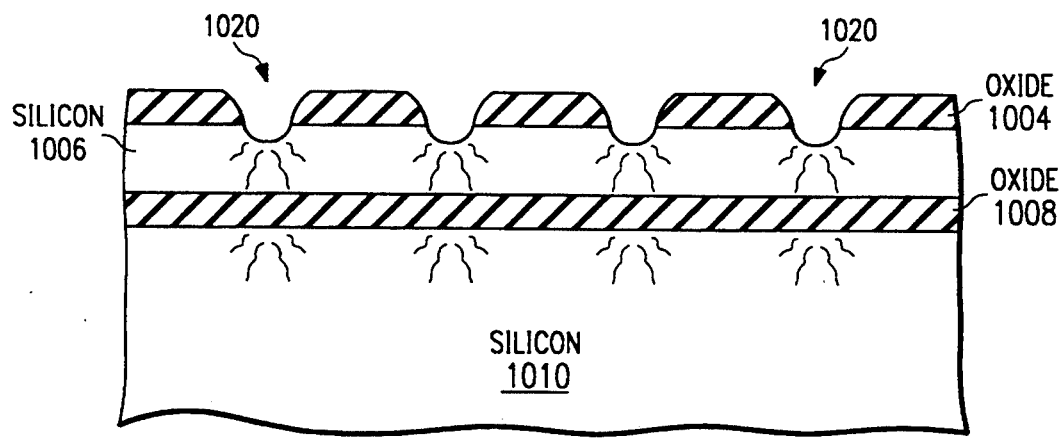
FIG. 10 illustrates another preferred embodiment method.

Diode 800 can be fabricated by modifying the second preferred embodiment method as follows. Perform the second preferred embodiment method up through the step of growing the second oxide to a thickness of about 4 nm. Then insert the wafer into an ion beam lithography machine, and use a beam of protons (hydrogen ions) at 20 KeV to remove oxide in 4 nm diameter openings from the top oxide in a grid pattern such as illustrated in FIGS. 9a–c. Focus the ion beam to a spot size of less than 4 nm, and raster scan the ion beam across the wafer. Note that the beam need not be aligned to anything and may produce any pattern with openings narrow enough to exclude 4 nm diameter circles. The low pressure within an ion beam machine will desorb roughly one monolayer of the top oxide in the form of SiO from areas not sputtered away, and the redeposition of the sputtered SiO will be minimal. In effect, about a monolayer of SiO may be lost due to evaporation in the low process, and some silicon beneath the openings in the sputtered oxide will also be sputtered away or removed by formation of water vapor. The crystal damage will not be severe due to the low beam energy, and a later temperature cycle will anneal out the damage. See FIG. 10 which indicates crystal damage with wavy lines and shows silicon substrate 1010, implanted oxide tunneling barrier 1008, silicon quantum well 1006, and grown oxide tunneling barrier 1004 with openings 1020.

Next, remove the wafer from the ion beam machine and again clean with HF/NH$_4$F and water rinses to remove native oxide which grows on the silicon exposed in openings 1020 in grid oxide 1004. This also removes about 2 nm of oxide 1004, leaving just a little more than the desired less than 2 nm thick tunneling barrier. Again, the HF/NH$_4$F rinse stabilizes the oxide-free silicon surface exposed by the openings in oxide 1004 through formation of a hydride monolayer. Then insert the wafer into a molecular beam epitaxy (MBE) growth chamber and desorb the hydrogen and anneal the ion beam crystal damage with a short temperature cycle up to 800° C. and then grow undoped epitaxial silicon at 500° C. The short high temperature cycle anneals out the residual crystal damage without significantly evaporating oxide; the usual MBE native oxide desorption employs 1000°–1250° C. The epitaxial growth begins on the silicon exposed by the oxide openings 1020 and eventually spreads laterally across oxide 1004. Continue growth until the silicon is 6 nm thick on oxide 1004. Then switch to a doped silicon growth by adding a beam of antimony or arsenic or phosphorus to the silicon beam; or the wafer may taken out of the MBE system and an epilayer of doped silicon grown by MOCVD of LPCVD.

After the silicon growth, lithographically pattern and etch to form the mesa structure plus deposit contact metal to complete the diode.

Note that generally during the high temperature segregation anneal, implanted oxide may aggregate into a lumpy layer with apparent openings; that is, may look something like grid oxide 1004. As discussed with respect to the grid oxide tunneling barrier, a lumpy layer will adequately perform as a tunneling barrier provided any openings are small enough to prevent direct electron conduction without tunneling. Indeed, the implantation of oxygen may be non uniform to encourage a lumpy segregation which may be more efficient and have a better oxide/silicon interface. In fact, with a lumpy layer, the average layer thickness may be greater than that of an equivalent uniform layer and still provide the same effective tunneling barrier height and thickness.

Double Implant Tunneling Barriers

A third preferred embodiment method of fabrication of diode 400 uses two implants at different energies and avoids growth of the quantum well. In particular, again follow steps (1)–(3) of the first preferred embodiment method of fabrication for diode 400 except use an implant energy of about 3.5 KeV to have a peak oxygen concentration at about 8 nm below the surface and a projected straggle of about 6 nm. Next, apply rapid thermal annealing in an inert atmosphere to briefly raise the temperature of the near surface region to 1400° C. to segregate the oxygen into a 2 nm thick oxide layer centered about 8 nm below the surface. Next, again implant oxygen as in step (3) of the first preferred embodiment (dose about $1 \times 10^{16}$/cm$^2$ and energy about 1 KeV) to create an oxygen region with peak oxygen concentration about 2.2 nm below the surface with a straggle of about 1.6 nm. Then again rapid thermally anneal to segregate the shallow oxygen into a second 2 nm thick oxide layer, this layer centered about 2 nm below the surface. This rapid thermal annealing only improves the oxide layer 8 nm below the surface. The net result is about 1 nm of single crystal silicon on a double barrier (2 nm oxide tunneling layers on either side of a 4 nm single crystal silicon quantum well) which is on a silicon substrate. Either epitaxial silicon or another conductor can be deposited on the top 1 nm silicon to form the diode anode.

Third Preferred Embodiment

Figure 11:
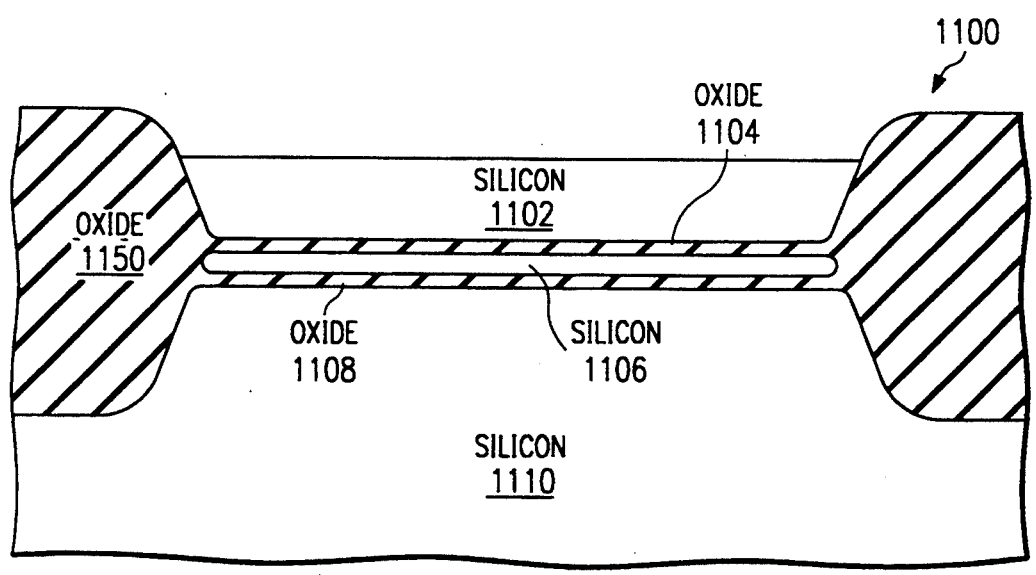
FIG. 11 shows another preferred embodiment diode.

FIG. 11 heuristically illustrates in cross sectional elevation view third preferred embodiment silicon/oxide resonant tunneling diode 1100 which differs from diodes 400 and 800 by having oxide isolation rather than mesa isolation. Indeed, diode 1100 may be fabricated along the lines of either diode 400 or diode 800 with replacement of the final mesa etching replaced by a masked thermal oxidation or oxygen implantation to form isolation oxide 1150. Such a thermal oxidation could be combined with or enhance a segregation anneal of implanted oxygen into a tunneling barrier. Otherwise, oxide tunneling barriers 1104/1108 and silicon quantum well 1106 plus silicon anode 1102 and cathode 1110 have the same characteristics as the corresponding parts of either diode 400 or diode 800.

Multipeak Resonances

The preferred embodiments may be extended to multiple quantum wells in series to form resonant tunneling diodes with multiple resonant peaks simply be growing further tunneling barriers and quantum wells on the preferred embodiment structures. Indeed, with successive abutting quantum wells and tunneling barriers grown, a super-lattice structure may be obtained analgous to that of the Tsu patent cited in the background.

Applications

Figure 1:
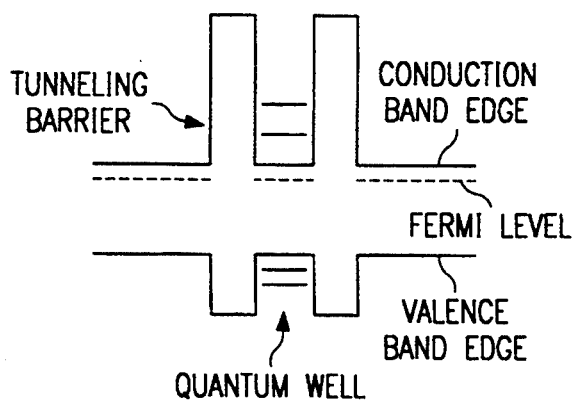
FIGS. 1–3b are band diagrams of a known resonant tunneling diode together with a current-voltage diagram.
Figure 2:
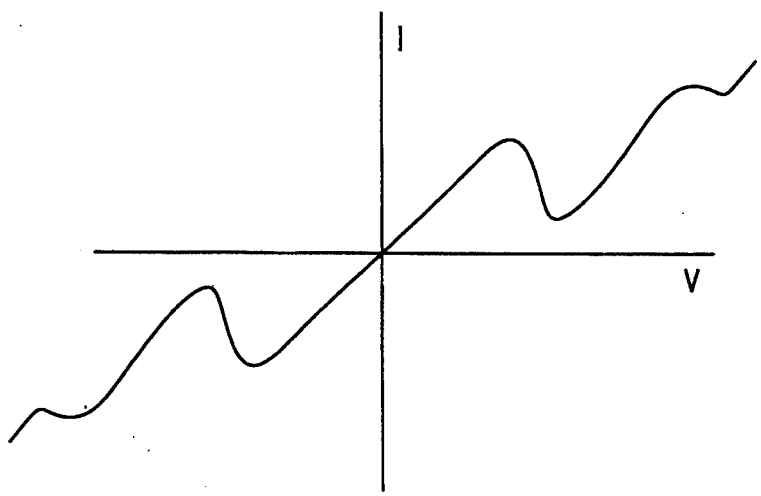
Figure 3A:
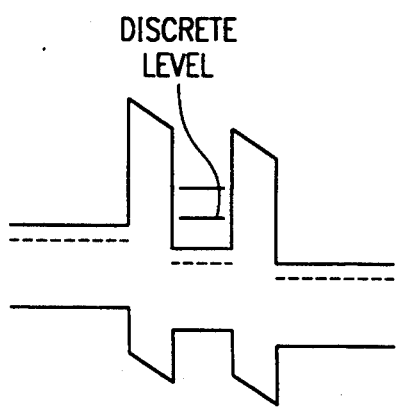
Figure 3B:
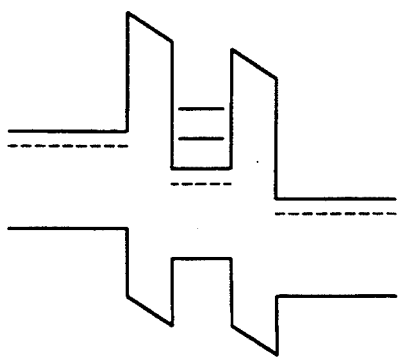
Figure 12A:
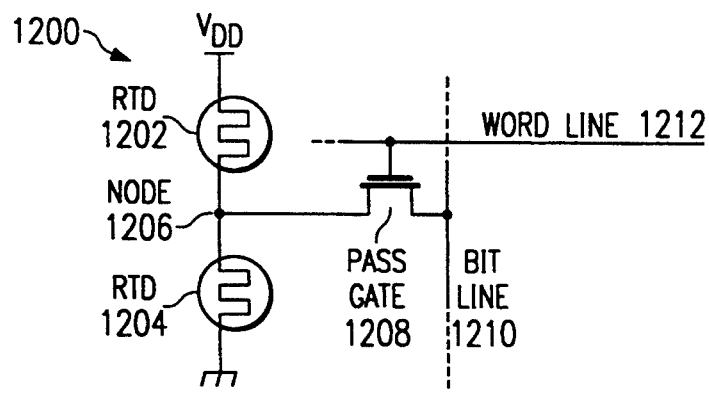
FIGS. 12a–c show a memory cell application of the preferred embodiment diodes.
Figure 12B:
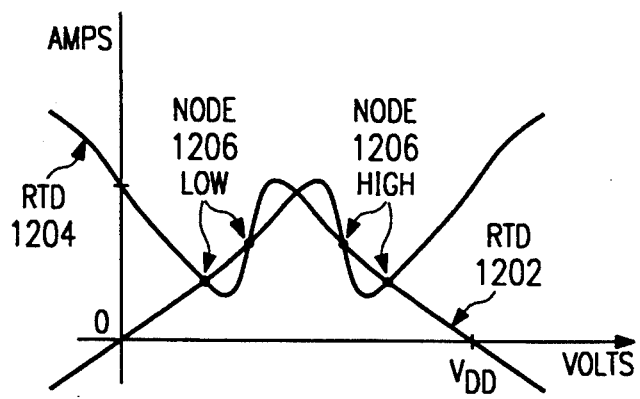
Figure 12C:
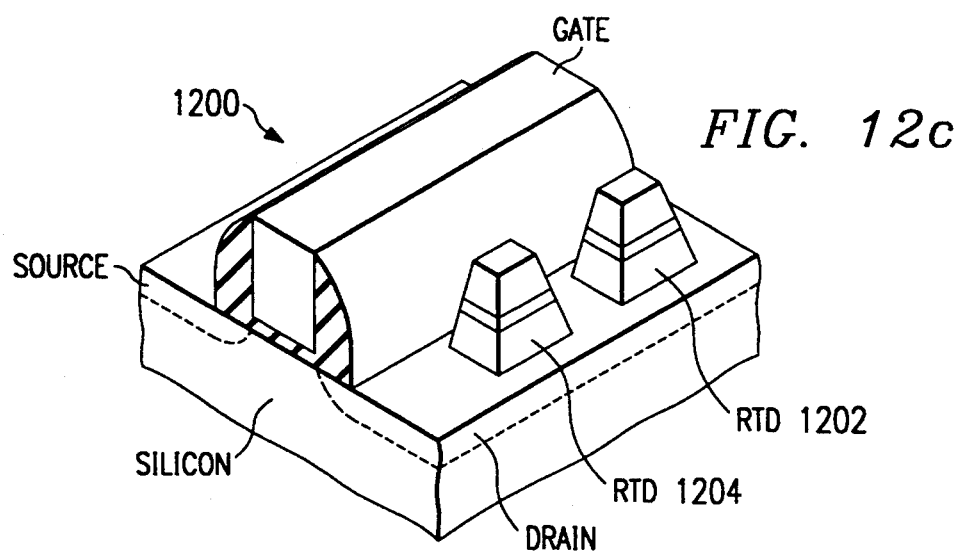

The preferred embodiments diodes may be incorporated into various structures such as the memory cell illustrated in FIGS. 12a–c. In particular, FIG. 12a schematically shows static random access memory (SRAM) cell 1200 as including resonant tunneling diodes 1202 and 1204 in series (RTD 1202 acts as the load for RTD 1204) and coupled to bifline 1210 by silicon field effect transistor pass gate 1208 controlled by the voltage on word line 1212. The bistability of node 1206 of cell 1200 derives from the bias voltage Vdd being set a little greater than the current valley of each RTD, so one RTD operates in its valley and the other RTD operates with small bias. FIG. 12b shows the superimposed current-voltage curves for RTDs 1202–1204 where each RTD has the characteristics illustrated in FIG. 2. The intersection points (a pair for the voltage on node 1206 close to Vdd (high) and a pair for node 1206 (low) indicate the stable series operation points. And accessing node 1206 through pass gate 1208 with a large driver to force node 1206 either high or low will force cell 1200 into a desired stable state; whereas, a sense amplifier accessing node 1206 through pass gate 1208 will detect the cell's state without disruption. Of course, a larger peak-to-valley ratio in the RTDs than that shown in FIG. 2 will make the high and low stable voltages for node 1206 closer to Vdd and 0, respectively.

FIG. 12c illustrates in perspective view the structure of FIG. 12a using a single silicon field effect transistor plus the preferred embodiment RTDs. Note that the parallel arrangement of the RTDs on the field effect transistor drain permits simultaneous fabrication with a mesa etch defining the locations of the RTDs.

Modifications and Advantages

The preferred embodiments may be varied in many ways while retaining one or more of the features of epitaxial alignment of anode, cathode, and quantum well layers by implantation to form at least one of the barriers.

For example, the dimensions of the tunneling barriers and quantum well(s) could be varied: the tunneling barriers could be thinner for higher current, the tunneling barriers could be of differing thicknesses, and the quantum well thickness could be varied to adjust the resonant levels up or down. Any grid oxide patterns could be varied and irregular (and nonperiodic) provided no openings with too large a diameter appear. The ion beam removal of oxide to form the tunneling barrier grids could be inert gas ions such as helium, neon, argon, krypton, or xenon which would provide a larger mass ion for selectable momentum transfer efficiency and still yield neutral products which evaporate. Heterojunction bipolar transistors with resonant tunneling diodes imbedded in the emitters and with silicon-germanium bases or homojunctions bipolar transistors with resonant tunneling diodes imbedded in the emitters may be fabricated.

Other tunneling barrier materials such as oxynitrides could be formed by implantation of oxygen and nitrogen. Silicon-germanium compounds could provide the substrates or the epitaxial growth or both.

The tunneling barrier oxide by implantation has the advantage of providing resonant tunneling structures in the standard silicon/oxide materials system. And in transistors and circuits the resonant tunneling structures have an advantage of increasing the amount of logic or memory performed per unit area. For example, resonant tunneling bipolar transistors consisting of resonant tunneling elements in the emitter of conventional bipolar transistors have been used to construct full adder circuits with one third the usual number of transistors and one third the gate delay of conventional technology.

What is claimed is:

1. A method of fabricating a resonant tunneling diode, comprising the steps of:
   (a) providing a layer of a semiconductor material;
   (b) implanting a first dose of a species into said layer;
   (c) segregating said dose into a first tunneling barrier located within said layer; and
   (d) forming a second tunneling barrier within said layer and spaced from said first tunneling barrier, thereby forming a quantum well between said first and second tunneling barriers.

2. The method of claim 1, wherein:
   (a) said semiconductor material is silicon;
   (b) said species is oxygen; and
   (c) said first tunneling barrier is made of silicon oxide.

3. The method of claim 1, wherein:
   (a) said forming a second tunneling barrier of step (d) of claim 1 includes the substeps of (i) adding a quantity of said semiconductor material to a surface of said layer adjacent to said first tunneling barrier, (ii) implanting a second dose of a second species into said layer, and (iii) segregating said second dose into said second tunneling barrier.

4. The method of claim 1, wherein:
   (a) said forming a second tunneling barrier of step (d) of claim 1 includes the substeps of (i) implanting a second dose of a second species into said layer and (ii) segregating said second dose into said second tunneling barrier.

5. The method of claim 4, wherein:
   (a) said second species is oxygen; and
   (b) said first dose and said second dose are equal.

6. A method of fabrication of a resonant tunneling diode, comprising the steps of:
   (a) providing a layer of a semiconductor material;
   (b) implanting a first dose of a species into said layer;
   (c) segregating said dose into a first tunneling barrier located within said layer; and
   (d) forming a second tunneling barrier at a surface of said layer adjacent said first tunneling barrier and spaced from said first tunneling barrier, thereby forming a quantum well between said first and second tunneling barriers.

7. The method of claim 6, wherein:
   (a) said semiconductor material is silicon;
   (b) said species is oxygen; and
   (c) said first tunneling barrier is made of silicon oxide.

8. The method of claim 7, wherein:
   (a) said forming a second tunneling barrier of step (d) of claim 6 includes growing silicon oxide on said surface and then forming a terminal on said grown silicon oxide.

9. The method of claim 7, wherein:
   (a) said forming a second tunneling barrier of step (d) of claim 6 includes the substeps of (i) growing silicon oxide on said surface, (ii) forming at least one opening in said grown silicon oxide, and (iii) epitaxially growing silicon through said at least one opening and onto said grown silicon oxide.

* * * * *